United States Patent [19]
Yee et al.

[11] Patent Number: 5,623,420
[45] Date of Patent: Apr. 22, 1997

[54] METHOD AND APPARATUS TO DISTRIBUTE SPARE CELLS WITHIN A STANDARD CELL REGION OF AN INTEGRATED CIRCUIT

[75] Inventors: Clayton L. Yee; Sandeep Aji, both of San Francisco; Stefan Rusu, Sunnyvale, all of Calif.

[73] Assignee: Sun Microsystems, Inc., Mountain View, Calif.

[21] Appl. No.: 340,706

[22] Filed: Nov. 16, 1994

[51] Int. Cl.⁶ .................................................. G06F 17/50
[52] U.S. Cl. .......................... 364/490; 364/488; 364/489
[58] Field of Search .................................. 364/488, 489, 364/490, 491, 468

[56] References Cited

U.S. PATENT DOCUMENTS

| | | | |
|---|---|---|---|
| 4,783,749 | 11/1988 | Duzy et al. | 364/491 |
| 4,975,854 | 12/1990 | Yabe | 364/491 |
| 5,222,031 | 6/1993 | Kaida | 364/491 |
| 5,495,419 | 2/1996 | Rostoker et al. | 364/468 |
| 5,497,334 | 3/1996 | Russell et al. | 364/489 |

OTHER PUBLICATIONS

"Fault Tolerant Memory Designs for Improved Yield and Reliability", by A. Noore, IEEE Circuits and Systems, 1990 IEEE International Symposium, pp. 2744–2747.

"An Algorithm for Placement of Standard Cells in Integrated Circuit", by R. Kuznar and B. Zajc, IEEE, MELECON '91: Mediterranean Electrotechnical Conference, pp. 234–237.

"A Fault-Tolerant Array Processor Designed for Testability and Self-Reconfiguration", by Jain et al. IEEE Journal of Solid-State Circuits, vol. 26, No. 5, May 1991, pp. 778–788.

"Probabilistic Analysis and Algorithms Reconfiguration of Memeory Arrays", by W. Shi and K. Fuchs, IEEE Transactions on Computer–Aided Design, vol. 11, No. 9, Sep. 1992, pp. 1153–1160.

"Hypergraph Coloring and Reconfiguration RAM Testing", by M. Franklin and K. Saluja, IEEE Transactions on Computers, vol. 43, No. 6, Jun. 1994, pp. 725–736.

*Primary Examiner*—Kevin J. Teska
*Assistant Examiner*—Russell W. Frejd
*Attorney, Agent, or Firm*—Flehr, Hohbach, Test, Albritton & Herbert

[57] ABSTRACT

A method and apparatus to distribute spare cells into a standard cell region of an integrated circuit is described. An initial layout of standard cells is first generated by a place and route tool. Afterwards, the initial layout is processed by a spare cell distribution mechanism that simultaneously processes a directive file. The spare cell distribution mechanism distributes, according to a predefined criteria, a preselected cluster of spare cells within the initial layout of standard cells. This processing results in an optimal distribution of spare standard cells within the standard cell region of the semiconductor. The spare cell distribution mechanism also inserts vertical wire terminators into the standard cell region to promote vertical routing, and thus shorter routing paths. In addition, the spare cell distribution mechanism inserts ground connectors and power connectors in the standard cell region to generate a ground and power paths. The outputs of the inserted spare cells may be connected to the ground and power paths until they are subsequently re-routed to correct logic defects in the standard cell region.

15 Claims, 5 Drawing Sheets

METHOD AND APPARATUS TO DISTRIBUTE SPARE CELLS WITHIN A STANDARD CELL REGION OF AN INTEGRATED CIRCUIT

BRIEF DESCRIPTION OF THE INVENTION

This invention relates generally to the use of electronic design automation tools to design integrated circuits. More particularly, this invention describes an electronic design automation tool and methodology that permits the distribution of spare cells into an existing standard cell region of an integrated circuit layout.

BACKGROUND OF THE INVENTION

Very Large Scale Integration (VLSI) circuits are designed with the use of Electronic Design Automation (EDA) tools, also called Computer Aided Design (CAD) tools. Typically, the design process begins with a circuit being specified in a Hardware Description Language (HDL), such as Verilog or VHDL. The HDL description is a set of statements in a computer language format that define the functional operation to be performed by the circuit.

An HDL circuit simulator is used to run a circuit simulation of the HDL description. Modifications to the HDL description are made based upon the results of the HDL circuit simulation.

In addition to its function as a simulator of an HDL description, the HDL circuit simulator is used to generate a netlist. A netlist defines the components and interconnections between the components required to implement the functional operation specified in the HDL circuit description.

Once a netlist has been generated, there are a number of commercially available "silicon compilers", also called "place and route tools", that are used to convert the netlist into a semiconductor circuit layout. The semiconductor circuit layout specifies the physical implementation of the circuit in silicon, or some other semiconductive material.

A semiconductor circuit layout can be divided into different functional regions. Large dedicated functions are typically assigned to a functional region of a circuit. Smaller tasks that are not associated with large dedicated functions are typically implemented in an area of a semiconductor called a random logic region. The random logic region uses a selection of standard cell logic gates. Examples of standard cells include NAND gates, flip-flops, and multiplexers. They are called standard cells because, when implemented in silicon, each cell has a standard height. This allows the cells to be aligned with one another to form standard cell tracks. Signal routing tracks are then positioned between standard cell tracks. Metal connections between the routing tracks and standard cells allows specified logic to be executed by the standard cells of the standard cell tracks.

After a circuit has been placed and routed, a number of known techniques are used to verify the performance of the semiconductor circuit. The verification techniques may identify problems in the performance of the semiconductor circuit. In the case of the standard cell region (typically the random logic region of the semiconductor circuit), these problems are solved by placing additional standard cells at the ends of the standard cell tracks. The additional standard cells can then be connected to other standard cells to correct any problems.

The problem with this technique is that signal traces between the added standard cells and the original standard cells can be long, since the added standard cells are at the end of a standard cell track. The long signal traces result in capacitance problems in the signal paths of the semiconductor circuit. Another problem with this technique is that the place and route tool may have a difficult time even establishing a suitable signal trace between the added standard cells and the original standard cells.

SUMMARY OF THE INVENTION

The invention is an apparatus to distribute spare cells into a standard cell region of an integrated circuit. An initial layout of standard cells is first generated by a place and route tool running on a general purpose computer. Afterwards, the initial layout is processed by a spare cell distribution mechanism, running on the general purpose computer, which simultaneously processes a directive file. The spare cell distribution mechanism distributes, according to a predefined criteria, a preselected group of spare cells within the initial layout of standard cells.

The method of the invention involves the steps of generating an initial layout of standard cells in an integrated circuit and then distributing, according to predefined criteria, a preselected group of spare cells within the initial layout of standard cells.

The predefined criteria used by the method and apparatus of the invention includes such considerations as the number of spare cell tracks, the number of cells in the block before adding spare cells, the area available for additional spare cells, the power consumption of spare cells to be inserted, and the logical function of the spare cells to be inserted.

The invention produces near optimal distribution of spare standard cells within the standard cell region of an integrated circuit. The spare cell distribution mechanism also inserts vertical wire terminators into the standard cell region to promote vertical routing, and thus shorter routing paths. In addition, the spare cell distribution mechanism inserts ground and power connectors in the standard cell region to generate additional ground and power paths. The inputs of the inserted spare cells may be connected to the ground or power paths until they are subsequently re-routed to correct logic defects in the standard cell region. That is, the inputs to the spare cells may be subsequently connected to different signal tracks in the spare cell region. At this time of re-routing, the ground and power paths may be converted by the place and route tool into signal tracks.

By distributing the cells throughout the standard cell region, the present invention avoids prior art problems arising from having inserted spare cells clustered at the end of a standard cell track. That is, the present invention avoids problems arising from excessive capacitances on routing tracks. The invention also provides the place and route tool with additional routing options, thereby facilitating the process of routing elements in a standard cell region of an integrated circuit.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
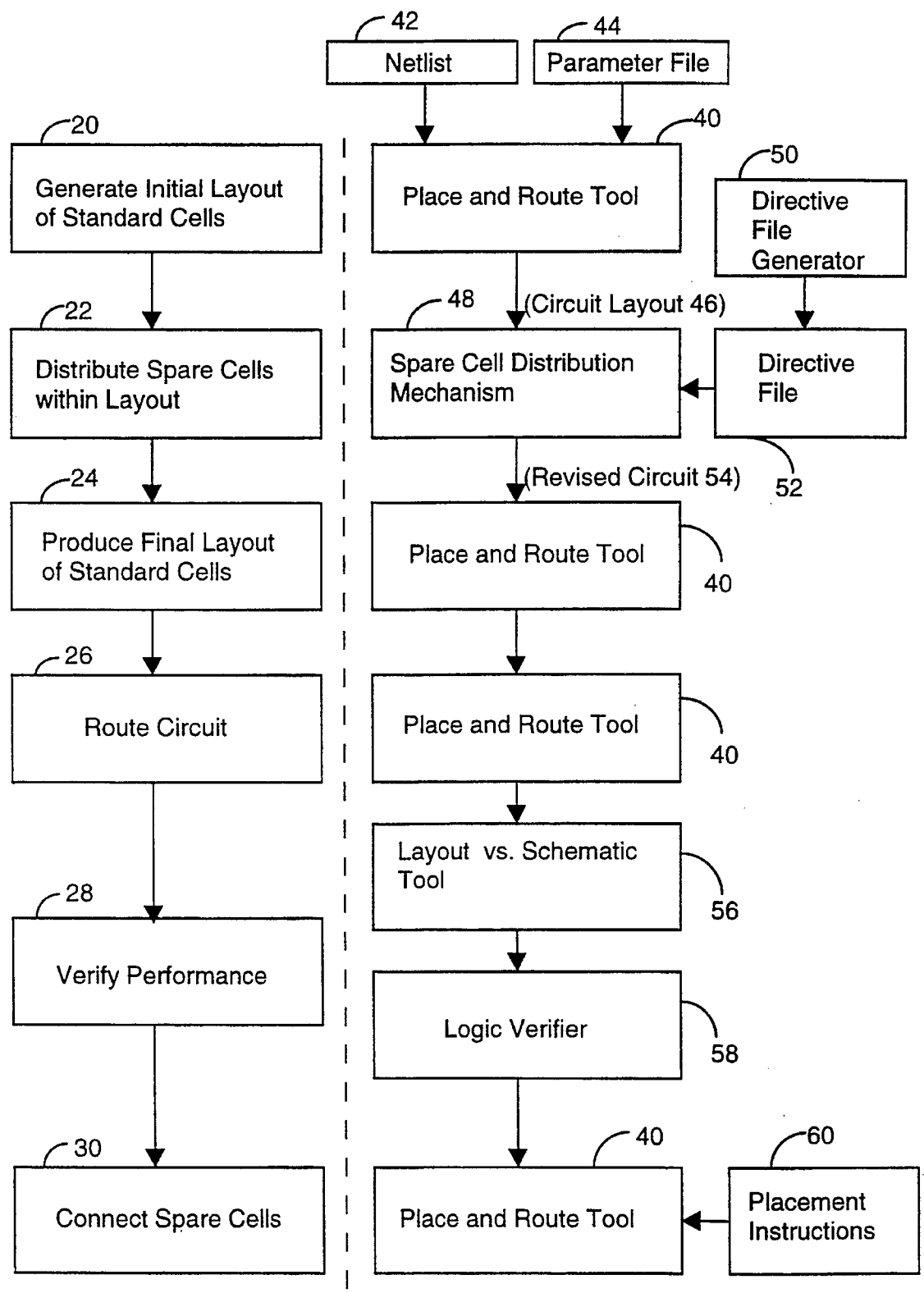
FIG. 1 illustrates, on its left side, the method associated with one embodiment of the present invention, and illustrates, on its right side, the corresponding apparatus to perform one embodiment of the specified method.

The left-side of FIG. 1 illustrates the processing steps used in accordance with one embodiment of the present invention. The first processing step is to generate an initial layout of standard cells (block 20). Afterwards, spare standard cells are distributed within the layout (block 22). The analogous step performed in the prior art is to insert spare standard cells at the end of the standard cell tracks. As described above, the prior art approach results in a number of problems. As will be described below, these problems are avoided with the present invention by distributing the spare standard cells within the initial layout of standard cells. It should be noted that spare cells cannot be distributed into a standard cell region of an integrated circuit before the initial layout because the number of spare cells that can be used is derived from initial layout parameters such as the number of standard cell tracks and the length of the different standard cell tracks.

The next step of the method is to produce a final layout of standard cells (block 24). Thereafter, the circuit is routed (block 26). That is, electrical connections are made between the various cells of the standard cell region.

The next step is to verify the performance of the circuit (block 28). If there are any problems in the logical performance of the circuit, then the spare cells are connected (block 30) to rectify the problems.

The methodology set forth on the left-side of FIG. 1 is more fully appreciated with reference to the corresponding devices used to perform the method, as shown on the right-side of FIG. 1. A commercially available place and route tool 40 is used to generate a circuit layout 46 that includes an initial layout of standard cells. In accordance with prior art techniques, the place and route tool receives a netlist 42 that specifies a circuit and a parameter file 44 that specifies permissible attributes of the standard cell region, such as the number of standard cell tracks that can be used, routing parameters, input/output port information, and block footprint information.

The circuit layout 46 specifies different positions in the integrated circuit and the logical elements at those positions. More particularly, the physical elements, such as diffusion, polysilicon, and metal regions used to implement the logical elements are specified at the different positions.

The circuit layout 46 is passed to the spare cell distribution mechanism 48 of the invention. The spare cell distribution mechanism 48 receives a directive file 52 as a second input. The directive file 52 may be manually generated or derived with a directive file generator 50. As will be described below, the spare cell distribution mechanism 48 alters the physical layout, specifically the standard cell layout, received from the place and route tool 40, as specified by the operations established in the directive file. This processing results in an optimal distribution of spare standard cells within the standard cell region of the semiconductor circuit. The distribution mechanism 48 also produces vertical wire terminators to promote vertical routing, and thus shorter routing paths in the standard cell region. In addition, the distribution mechanism 48 inserts ground and power connectors in the standard cell region to produce additional signal tracks, thereby improving routing options.

After the completion of the processing by the spare cell distribution mechanism 48, the remaining processing may be performed in accordance with prior art techniques. Specifically, the revised circuit layout 54 with the distributed spare cells is passed to the place and route tool 40, which executes optimization operations in order to produce a final layout. The final layout is then further processed by the place and route tool 40 to establish the routing connections in the circuit. The performance of the circuit is then verified through the use of a layout versus schematic tool 56 and a logic verifier 58. The layout versus schematic tool is a commercially available device that compares the circuit layout to the netlist to insure that there is a strict correspondence between the two circuit descriptions. Once a strict correspondence is obtained, then the logic of the circuit can be tested by passing the netlist to a commercially available logic verifier 58. The spare cell distribution mechanism 48 may include a set of instructions to revise the netlist so as to insert the spare standard cells, vertical wire terminators, and ground connectors into the netlist, as the same elements are inserted into the routed circuit. The revision of the netlist may also be performed manually, if desired.

After the logic verifier 58 is used to verify the performance of the circuit, spare cells are connected, as necessary to correct any logic problems. Placement instructions 60 may be provided to the place and route tool 40 to perform this operation. In the alternative, the spare cells may be connected through manual operations known in the art.

Figure 2:
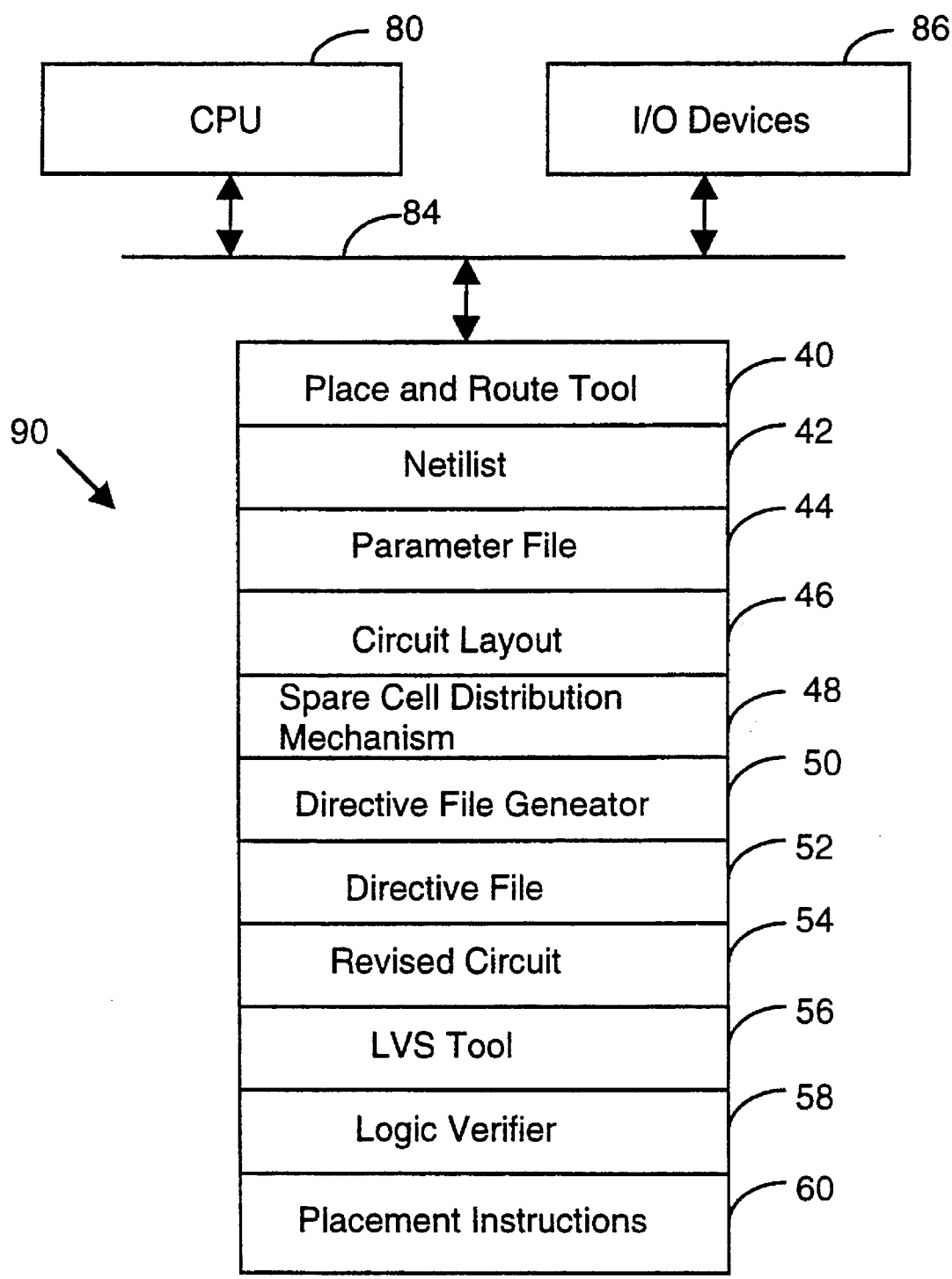
FIG. 2 illustrates a general purpose computer that may be used in accordance with the invention.

FIG. 2 illustrates a general purpose computer incorporating the elements required to execute the method of the invention. The figure shows a central processing unit (CPU) 80 that interacts with input/output devices 86 over a system bus 84. The input output devices 86 may include a keyboard, monitor, mouse, printer, and other peripheral devices known in the art. A memory 90 communicates with the CPU 80 over the system bus 84. The memory stores programs and data 40–60 that are processed by the CPU 80. The programs and data 40–60 illustrated in FIG. 2 correspond to the programs and data shown in FIG. 1. In general, the execution of programs and data on a general purpose computer is known in the art. Attention presently turns to the unique programs and data processed in accordance with the present invention.

As indicated in the discussion with reference to FIG. 1, the present invention is primarily directed toward producing a revised circuit layout 54 that includes distributed spare standard cells. The revised circuit layout also includes vertical wire terminators and ground connectors, as will be described below.

The revised circuit layout 54 is obtained through the spare cell distribution mechanism 48 of the invention. The spare cell distribution mechanism 48 processes a circuit layout 46 and a directive file 52.

Figure 3:
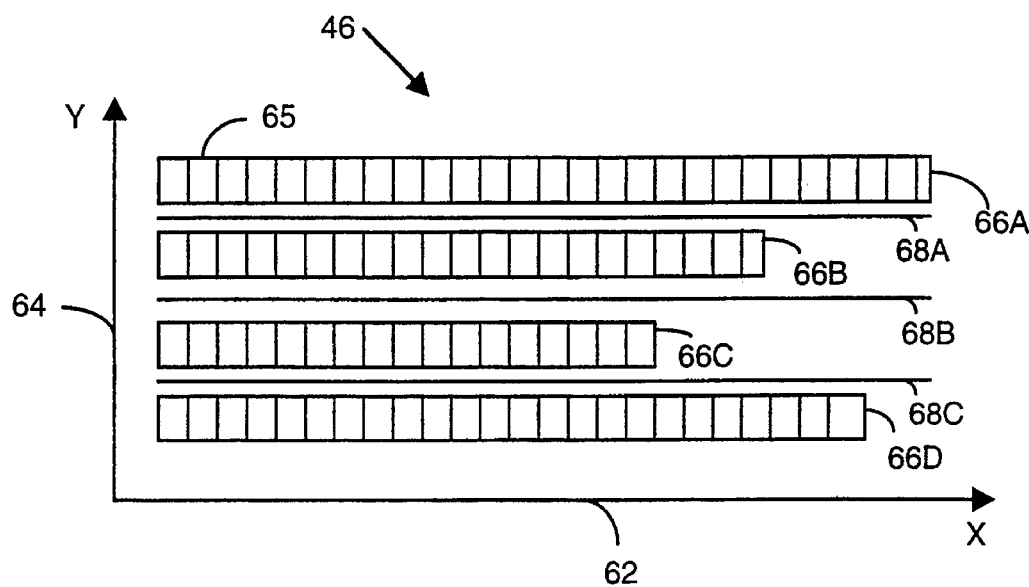
FIG. 3 is a simplified illustration of a portion of a standard cell region of an integrated circuit.

FIG. 3 illustrates a portion of a circuit layout 46. More particularly, the figure is a simplified illustration of the standard cell region of a circuit layout 46. To illustrate the concept that a circuit layout has a corresponding grid, FIG. 3 shows an X-axis 62 and a Y-axis 64. The grid may be used to specify the physical location of individual cells 65 within the circuit layout. The individual cells 65 are aligned to form standard cell tracks 66A, 66B, 66C and 66D. Routing tracks 68A, 68B, 68C are provided between the standard cell tracks 66.

Figure 4:
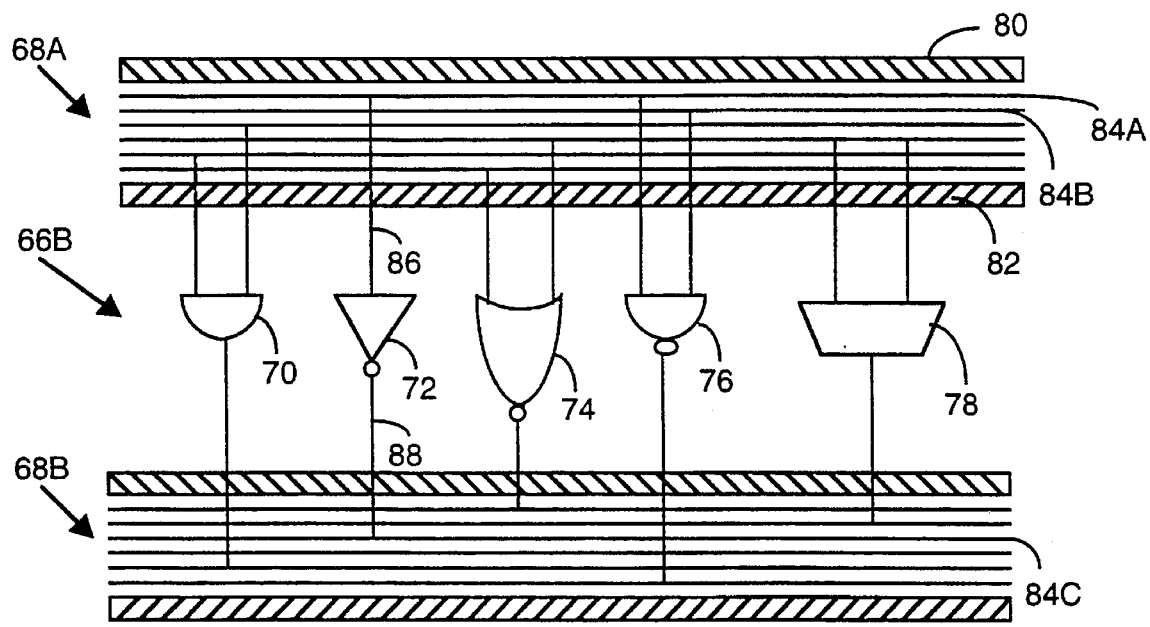
FIG. 4 is a more detailed illustration of the standard cell region of FIG. 3.

FIG. 4 is a more detailed representation of a portion of FIG. 3. In particular, FIG. 4 shows a segment of standard cell track 66B and a corresponding segment of routing tracks 68A and 68B. Standard cell track 66B includes a group of logical elements, including an AND gate 70, an inverter 72, a NOR gate 74, a NAND gate 76, and an adder 78. The logical elements of the standard cell track 66B are depicted in their common schematic form. However, it should be appreciated that in the actual layout, the elements would typically be immediately adjacent to one another, have a standard height, and be implemented as a set of different semiconductive regions and interconnects.

Each routing track 68 includes a power bus 80, signal tracks 84A, 84B, . . . , 84N, and a ground bus 82. It should be appreciated that these elements need not be on the same metal plane. That is, vias can be used to access tracks on different metal layers.

FIG. 4 also illustrates a signal track connector 86 that relays a signal from signal track 84A to inverter 72. The output of inverter 72 is fed to signal track connector 88 that terminates on a signal track 84C. Connections of this type may be used to route signals from one logical element to another.

Figure 5:
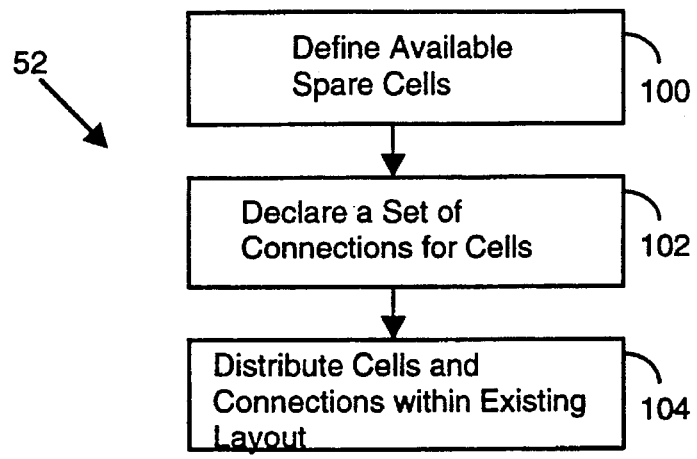
FIG. 5 illustrates the processing instructions associated with one embodiment of the directive file used in accordance with the invention.

FIG. 5 illustrates the operations associated with one embodiment of a directive file 52 that may be used in accordance with the invention. The first operation associated with the directive file 52 is to define available spare cells 100 that may be incorporated into an existing standard cell layout 46. As will be described below, the available spare cells are placed in groups. The next step is to declare a set of connections for the cells (block 102). That is, to declare a set of connection points or ports that may be used by the place and route tool 40 (FIG. 1) to interconnect the new spare cells and the existing standard cells. The final step is to distribute the cells and connections within the existing layout (block 104).

The directive file 52 may be manually generated, or it may be generated through a directive file generator 50 (FIG. 1). The directive file generator 50 is a computer program that incorporates predefined criteria that is used to establish a directive file 52. The predefined criteria to establish a directive file 52 includes a number of considerations. By way of example, the predefined criteria may include a consideration of the available space for spare cells. That is, after the place and route tool 40 establishes a circuit layout 46, a determination can be made as to how much space is available for additional cells. For example, in FIG. 3, it can be seen that standard cell tracks 66B and 66C can accept a number of additional cells, whereas standard cell tracks 66A and 66D cannot accept additional cells since they already extend to the right end of the X-axis 62.

Another consideration that can be used as part of the predefined criteria is the number of standard cell tracks 66 in the standard cell region of the semiconductor. As will be discussed below, the number of standard cell tracks 66 can be used in deriving a distribution scheme for the added spare cells. A related consideration is the number of standard cells in the standard cell region.

As indicated above, the directive file 50 defines available spare cells. The predefined criteria may be used to establish the available spare cells. For example, the predefined criteria may use frequently used logical elements, such as NAND gates, in determining the available spare cells. The directive file generator 50 may also rely upon predefined criteria such as the power consumption of standard cells. For example, low power consumption cells may be selected for distribution into the standard cell region.

As discussed above, the directive file 52 "distributes" cells within the existing layout. The term "distribute" refers to the fact that the standard cells are not simply positioned at the end of an existing standard cell track. Instead, the inserted spare standard cells are positioned in various distributed locations in a standard cell track 66. Another predefined criteria that may be used by a directive file generator 50 to establish a distribution scheme for a directive file 52, is to establish predetermined positions within a standard cell track 66 that are available for the insertion of spare standard cells. For example, the predetermined positions may be at the left side of the track 66 (the X=0 coordinate value), and ¼ the length of the track 66, ½ the length of the track 66, and ¾ the length of the track 66.

The distribution criteria specified by the directive file generator 50 and incorporated into the directive file 52 may include vertical routing considerations. That is, terminating devices may be distributed into the standard cell region so as to force the place and route tool to make vertical connections, thereby reducing signal path lengths.

Another predefined criteria that may be used to distribute spare cells is clustering. That is, a cluster of groups of standard cells may be selected. The same cluster of groups may then be inserted into the standard cell region. More particularly, the cluster of groups, through a cell cluster insertion operation, may be repeatedly inserted into different sets of standard cell tracks. This operation and the other predefined criteria is more fully appreciated through the following discussion, which includes a specific example of a directive file 52.

Figure 6:
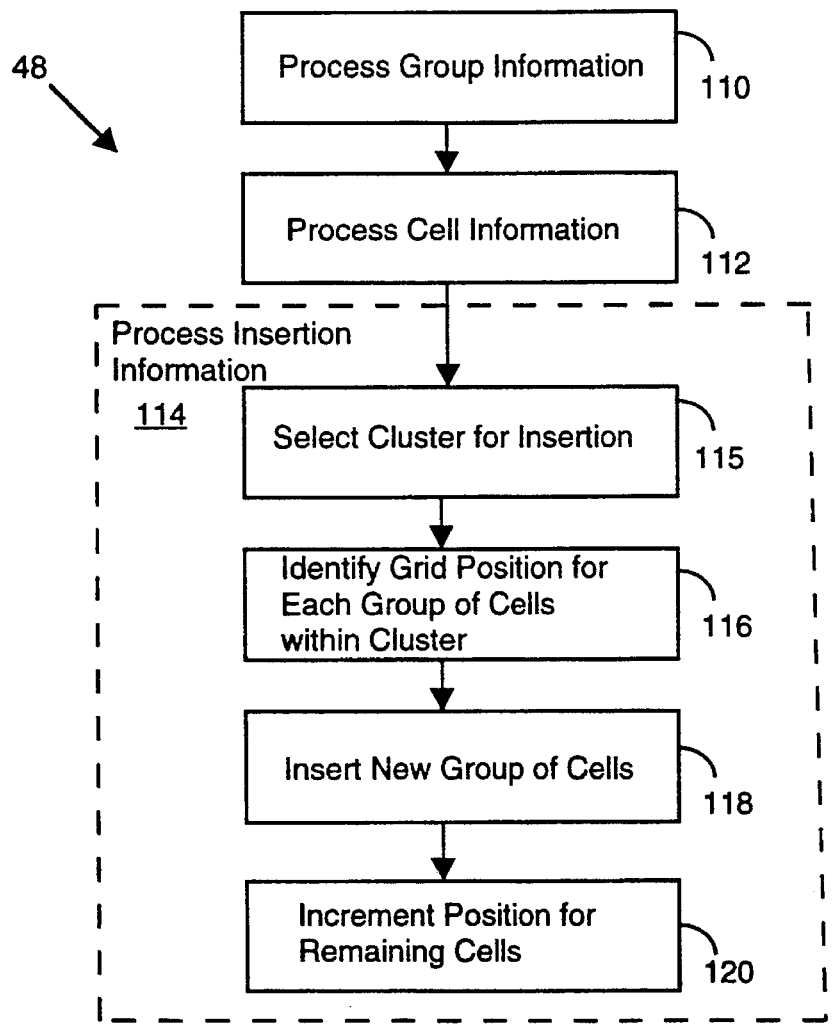
FIG. 6 illustrates the processing associated with one embodiment of the spare cell distribution mechanism of the invention.

FIG. 6 illustrates the processing of the directive file 52 by the spare cell distribution mechanism 48 of the invention. The first step is to process group information (block 110). As will be described below, group information refers to a characterization of the different groups of standard cells that are to be inserted into the standard cell region of the circuit layout. The group information need not be limited to standard cells to be inserted. As will be shown below, it can include vertical wire terminators, ground connectors, and power connectors.

The next step is to process cell information (block 112). Processing of cell information involves the specification of input and output ports for the spare cells. Cell information processing may also include the specification of ports for vertical wire terminators, ground connectors, and power connectors.

The final step associated with the spare cell distribution mechanism 48 is to process insertion information (block 114). The insertion information creates the directives that result in the actual insertion of spare standard cells into the existing circuit layout. This operation includes the step of selecting a cluster for insertion into a set of tracks (block 115). The next step is to identify a grid position for each group of cells within a cluster (block 116). As can be appreciated from FIG. 3, an X-coordinate position and a Y-coordinate position may be used to specify a particular cell location.

The next step is to insert a new group of cells (block 118) at the identified grid position. The final step is to increment the positions for the remaining cells (block 120). For example, if a new cell is inserted between the inverter 72 and NOR gate 74 of FIG. 4, then the X-coordinate position for the NOR gate 74, NAND gate 76 and adder 78 would be incremented accordingly. In the alternative, a new cell can be superimposed on an existing cell. Thereafter, the place and route tool would reposition all cells to accommodate the new cell.

Figure 7:
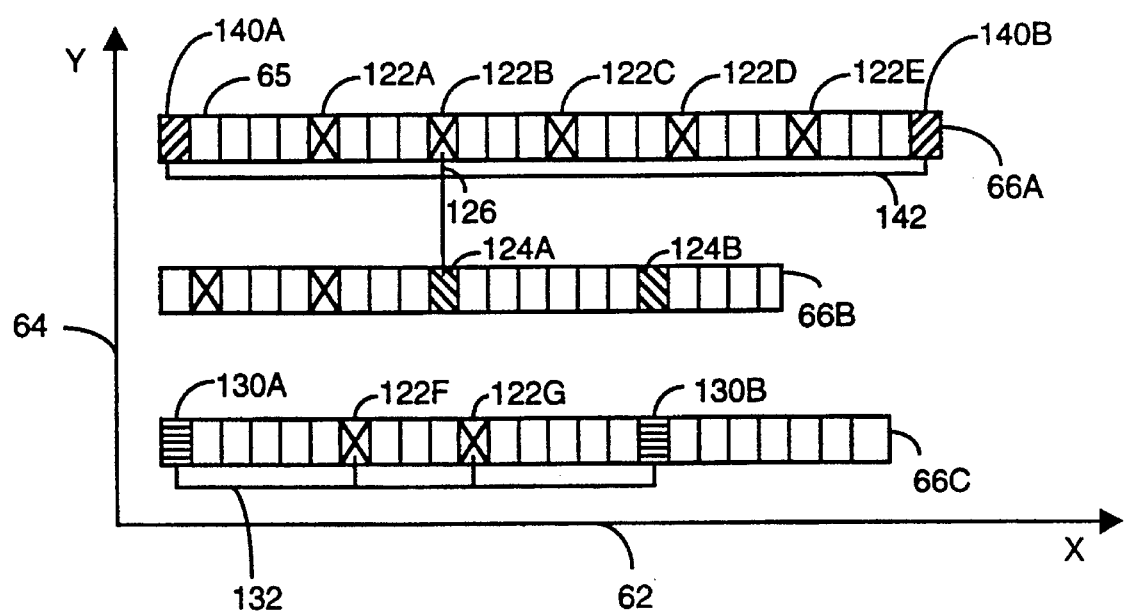
FIG. 7 depicts distributed standard cells that, in accordance with the invention, have been inserted into existing standard cell tracks.

To further illustrate the concepts of the invention, attention turns to a directive file 52 that has been used in accordance with the invention. The directive file is more fully appreciated with reference to FIG. 7. FIG. 7 depicts standard cell tracks 66A, 66B, and 66C. The standard cell tracks 66 include inserted spare standard cells 122. Standard cell track 66B also includes one or more vertical wire terminators 124. A vertical wire terminator 124 establishes an electrically floating connectable port in the standard cell track 66B. At the time of routing, the place and route tool generates a vertical connection 126 between vertical wire terminator 124A and cell 122B. Thereafter, an electrical contact may be made between the vertical connection 126 and a selected signal track (not shown in FIG. 7 for simplicity, but shown as element 84 in FIG. 4). That is, vertical wire 126 can be used to make a connection to cell 122B from any of the other tracks, which in turn are connected to other cells. This feature provides the place and route tool with greater flexibility. In addition, is allows for shorter signal routing lengths.

FIG. 7 illustrates another feature of the invention, namely power and ground connectors. The figure shows two inserted ground connectors 130A and 130B positioned in standard cell track 66C. Positioning of these devices at these locations forces the place and route tool to generate an inserted routing track 132. The routing track 132 can be used to tie the inputs of the inserted spare cells 122, as shown in FIG. 7. If the spare cells 122 are subsequently required for connection to other standard cells, then the place and route tool establishes such connections in accordance with prior art techniques.

FIG. 7 also illustrates the use of spare terminators. Spare terminators 140A and 140B are placed at the ends of routing track 66A. As will be described below, this forces the place and route tool to produce an additional signal track 142. The additional signal track can be used to facilitate routing in the circuit.

The foregoing information is more fully appreciated by studying the following directive file 52. The first portion of the directive file 52 relates to the group information that is processed by the spare cell distribution mechanism 48 in accordance with Block 110 of FIG. 6.

```
(BLOCK-INFO
  (GROUP-INFO
    (*Block A*)
    (group-cell-info sc_a 1 snd03c)
    (group-cell-info sc_b 1 snr03c)
    (group-cell-info sc_c 1 san03c)
    (group-cell-info sc_d 1 sor03c)
    (group-cell-info sc_e 1 xincmosf)
    (group-cell-info sc_f 1 sin00c)
    (group-cell-info sc_g 1 saoi21c)
```

-continued

```
    (group-cell-info sc_h 1 soai21c)
    (group-cell-info sc_i 1 sin00c)
      (*Block B*)
    (group-cell-info st_ivss1 1 spar_vss_con)
    (group-cell-info st_ivss2 1 spar_vss_con)
    (group-cell-info st_ivss3 1 spar_vss_con)
    (group-cell-info st_ivcc1 1 spar_vcc_con)
    (group-cell-info st_ivcc2 1 spar_vcc_con)
    (group-cell-info st_ivcc3 1 spar_vcc_con)
      (*Block C*)
    (group-cell-info st_oa 1 spar_terminator)
    (group-cell-info st_ob 1 spar_terminator)
    (group-cell-info st_oc 1 spar_terminator)
    (group-cell-info st_od 1 spar_terminator)
    (group-cell-info st_oe 1 spar_terminator)
    (group-cell-info st_of 1 spar_terminator)
    (group-cell-info st_og 1 spar_terminator)
    (group-cell-info st_oh 1 spar_terminator)
    (group-cell-info st_oi 1 spar_terminator)
      (*Block D*)
    (group-cell-info st_row1 1 spar_terminator)
    (group-cell-info st_row2 1 spar_terminator)
    (group-cell-info st_row3 1 spar_terminator)
    (group-cell-info st_row4 1 spar_terminator)
    (group-cell-info st_row5 1 spar_terminator)
    (group-cell-info st_row6 1 spar_terminator)
    (group-cell-info st_row7 1 spar_terminator))
```

Block A of the directive file defines a set of standard cell groups sc_a through sc_i. In order to simplify this discussion, each group includes one element, as indicated by the "1" in each line. An example of a defined group with three elements, instead of one, is as follows: "(group-cell-info sc_a 3 sndo3c sinoob snd03d)"

The final term in each line is the standard cell element that may be inserted into the standard cell region of the integrated circuit. In the first line of Block A, the standard cell element is "snd03c". This term specifies a three input NAND gate. The identification of each type of cell is not necessary for the purpose of describing the invention. The place and route tool, logic synthesizer or other electronic design automation tool used in conjunction with the invention can rely upon a library of cells to identify the type of cell being specified.

Block B defines ground and power connectors st_ivss1 through st_ivcc3. Each group includes one connector. For example, st_ivss1 includes the connector spar_vss_con. As previously described in relation to FIG. 7, ground and power connectors may be used to force the routing of an additional track 132. Thereafter, the output of the inserted standard spare cells may be tied to the additional track 132.

Block C defines a set of vertical wire terminators st_oa through st_oi. Each group includes one terminator, identified as spar_terminator. As discussed in relation to FIG. 7, the vertical wire terminators are used to force vertical routing paths 126 in the standard cell region of an integrated circuit.

Block D is a set of statements that are used to force a place and route tool to generate additional horizontal signal tracks in a standard cell region. Unlike the case of Block B where the additional track is used to ground an input of an inserted spare cells. The additional tracks created in this case are generally used for signal routing. This operation will be discussed below.

It can be appreciated that the invention provides techniques for generating additional vertical and horizontal routing tracks. Vertical tracks are produced in connection with the spare terminators specified in Block C, while horizontal tracks are produced in connection with the spare terminators specified in Block D. This feature simplifies the routing operation that is subsequently performed by a place and route tool.

The following blocks of code, Blocks E through H, correspond to the cell information that is processed by the spare cell distribution mechanism 48 at block 112 of FIG. 6. In general, the cell information is used to assign specific input or output port names to the items to be inserted into the standard cell region. The place and route tool may then use the specified names to make appropriate connections.

```
(CELL-INFO
    (*Block E*)
(cell-info snd03c sc_a 140 4 i1 sn_i1 i2 sn_i1 i3 sn_i1 out sn_oa)
(cell-info snr03c sc_b 196 4 i1 sn_i1 i2 sn_i1 i3 sn_i1 out sn_ob)
(cell-info san03c sc_c 168 4 i1 sn_i1 i2 sn_i1 i3 sn_i1 out sn_oc)
(cell-info sor03c sc_d 168 4 i1 sn_i1 i2 sn_i1 i3 sn_i1 out sn_od)
(cell-info xincmosf sc_e 168 2 i1 sn_i4 out sn_oe)
(cell-info sin00c sc_f 56 2 i1 sn_i4 out sn_of)
(cell-info saoi21c sc_g 168 4 ina1 sn_i1 ina2 sn_i1
    inb1 sn_i1 out sn_og)
(cell-info soai21c sc_h 140 4 ina1 sn_i1 ina2 sn_i1
    inb1 sn_i1 out sn_oh)
(cell-info sin00c sc_i 56 2 i1 sn_i4 out sn_oi)
    (*Block F*)
(cell-info spar_vss_con st_ivss1 28 1 out sn_i1)
(cell-info spar_vss_con st_ivss2 28 1 out sn_i2)
(cell-info spar_vss_con st_ivss3 28 1 out sn_i3)
(cell-info spar_vcc_con st_ivcc1 28 1 out sn_i4)
(cell-info spar_vcc_con st_ivcc2 28 1 out sn_i5)
(cell-info spar_vcc_con st_ivcc3 28 1 out sn_i6)
    (*Block G*)
(cell-info spar_terminator st_oa 28 1 in sn_oa)
(cell-info spar_terminator st_ob 28 1 in sn_ob)
(cell-info spar_terminator st_oc 28 1 in sn_oc)
(cell-info spar_terminator st_od 28 1 in sn_od)
(cell-info spar_terminator st_oe 28 1 in sn_oe)
(cell-info spar_terminator st_of 28 1 in sn_of)
(cell-info spar_terminator st_og 28 1 in sn_og)
(cell-info spar_terminator st_oh 28 1 in sn_oh)
(cell-info spar_terminator st_oi 28 1 in sn_oi)
    (*Block H*)
(cell-info spar_terminator st_row1 28 1 in sn_r1)
(cell-info spar_terminator st_row2 28 1 in sn_r2)
(cell-info spar_terminator st_row3 28 1 in sn_r3)
(cell-info spar_terminator st_row4 28 1 in sn_r4)
(cell-info spar_terminator st_row5 28 1 in sn_r5)
(cell-info spar_terminator st_row6 28 1 in sn_r6)
(cell-info spar_terminator st_row7 28 1 in sn_r7))
```

The first line of Block E describes the standard cell to be inserted ("snd03c") and its group ("sc_a"). It also specifies a numerical value (140) which when divided by 10 yields the width of the cell in microns. In addition, the code indicates that there are "4" ports associated with the cell. The three input ports i1, i2, and i3 have a common electrical connection, or net, sn_i1. This common electrical connection forces the place and route tool to tie them together with a common signal track. The output port is identified as sn_oa. The remaining lines of code in Block E follow the same format.

The code in Block F describes the ports for the power and ground connectors. The code follows the same form as Block E. Similarly, in Block G the ports for the vertical wire terminators are described. Finally, in Block H, the assigned ports for the terminators of block D are described.

The remaining blocks of code are directed toward the actual operation of inserting cells into the standard cell region of the integrated circuit. The previous blocks of code effectively declared and defined the available cells. The following code is used to actually position the available cells.

```
(INSERT-INFO
    (*Block I*)
(insert A 1 sc_a        1 0.250)
(insert A 1 sc_b        1 0.250)
(insert A 1 sc_e        1 0.500)
(insert A 1 st_ivcc1    1 0.500)
(insert A 1 sc_f        1 0.500)
(insert A 1 sc_c        1 0.750)
(insert A 1 sc_d        1 0.750)
(insert A 1 st_ivss1    1 L)
(insert A 1 st_ivss1    1 0.750)
(insert A 1 st_ivss1    1 L)
(insert A 1 st_row1     1 L)
(insert A 1 st_row1     1 R)
    (*Block J*)
(insert A 2 sc_a        1 0.250)
(insert A 2 st_oa       2 0.250)
(insert A 2 sc_c        2 0.250)
(insert A 2 sc_e        1 0.500)
(insert A 2 st_ivcc1    1 0.500)
(insert A 2 sc_f        2 0.500)
(insert A 2 sc_b        1 0.750)
(insert A 2 st_ob       2 0.750)
(insert A 2 sc_d        2 0.750)
(insert A 2 st_ivss1    1 L)
(insert A 2 st_ivss1    1 0.750)
    (*Block K*)
(insert A 3 sc_a        1 0.250)
(insert A 3 st_oa       3 0.250)
(insert A 3 sc_c        3 0.250)
(insert A 3 sc_e        1 0.500)
(insert A 3 st_ivcc1    1 0.500)
(insert A 3 sc_f        3 0.500)
(insert A 3 sc_b        1 0.750)
(insert A 3 st_ob       3 0.750)
(insert A 3 sc_d        3 0.750)
(insert A 3 st_ivss1    1 L)
(insert A 3 st_ivss1    1 0.750)
    (*Block L*)
(insert A 4 sc_a        2 0.250)
(insert A 4 st_oa       4 0.250)
(insert A 4 sc_c        3 0.250)
(insert A 4 sc_e        2 0.500)
(insert A 4 st_ivcc1    2 0.500)
(insert A 4 sc_f        3 0.500)
(insert A 4 sc_b        2 0.750)
(insert A 4 st_ob       4 0.750)
(insert A 4 sc_d        3 0.750)
(insert A 4 st_ivss1    1 L)
(insert A 4 st_ivss1    1 0.750)
    (*Block M*)
(insert A 5 sc_a        2 0.250)
(insert A 5 st_oa       5 0.250)
(insert A 5 sc_b        2 0.750)
(insert A 5 st_ob       5 0.750)
(insert A 5 sc_e        3 0.250)
(insert A 5 st_ivcc1    3 0.250)
(insert A 5 sc_f        3 0.750)
(insert A 5 sc_c        4 0.250)
(insert A 5 sc_d        4 0.750)
(insert A 5 st_ivss1    1 L)
(insert A 5 st_ivss1    1 0.750)
    (*Block N*)
(insert A 6 sc_a        2 0.250)
(insert A 6 st_oa       6 0.250)
(insert A 6 sc_b        2 0.750)
(insert A 6 st_ob       6 0.750)
(insert A 6 sc_e        3 0.500)
(insert A 6 st_ivcc1    3 0.500)
(insert A 6 sc_f        4 0.500)
(insert A 6 sc_c        5 0.250)
(insert A 6 sc_d        5 0.750)
(insert A 6 st_ivss1    1 L)
(insert A 6 st_ivss1    1 0.750)
    (*Block O*)
(insert A 7 sc_a        2 0.250)
(insert A 7 st_oa       7 0.250)
(insert A 7 sc_b        2 0.750)
(insert A 7 st_ob       7 0.750)
(insert A 7 sc_e        4 0.250)
(insert A 7 st_ivcc1    4 0.250)
(insert A 7 sc_f        4 0.750)
(insert A 7 sc_c        6 0.250)
(insert A 7 sc_d        6 0.750)
(insert A 7 st_ivss1    1 L)
```

```
(insert A 7 st_ivss1      1 0.750)
(*Block P*)
(insert B 1 sc_a          1 0.250)
(insert B 1 sc_b          1 0.250)
(insert B 1 sc_f          1 0.500)
(insert B 1 st_ivcc1      1 0.500)
(insert B 1 sc_g          1 0.750)
(insert B 1 sc_h          1 0.750)
(insert B 1 st_ivss1      1 L)
(insert B 1 st_ivss1      1 0.750)
(*Block Q*)
(insert B 2 sc_a          1 0.250)
(insert B 2 st_oa         2 0.250)
(insert B 2 sc_b          2 0.250)
(insert B 2 sc_f          2 0.500)
(insert B 2 st_ivcc1      2 0.500)
(insert B 2 sc_g          1 0.750)
(insert B 2 st_og         2 0.750)
(insert B 2 sc_h          2 0.750)
(insert B 2 st_ivss1      1 L)
(insert B 2 st_ivss1      1 0.750)
(*Block R*)
(insert B 3 sc_a          1 0.250)
(insert B 3 st_oa         3 0.250)
(insert B 3 sc_b          3 0.250)
(insert B 3 sc_f          3 0.500)
(insert B 3 st_ivcc1      3 0.500)
(insert B 3 sc_g          1 0.750)
(insert B 3 st_og         3 0.750)
(insert B 3 sc_h          3 0.750)
(insert B 3 st_ivss1      1 L)
(insert B 3 st_ivss1      1 0.750)
(*Block S*)
(insert B 4 sc_a          2 0.250)
(insert B 4 st_oa         4 0.250)
(insert B 4 sc_b          3 0.250)
(insert B 4 sc_f          3 0.500)
(insert B 4 st_ivcc1      3 0.500)
(insert B 4 sc_g          2 0.750)
(insert B 4 st_og         4 0.750)
(insert B 4 sc_h          3 0.750)
(insert B 4 st_ivss1      1 L)
(insert B 4 st_ivss1      1 0.750)
(*Block T*)
(insert B 5 sc_a          2 0.250)
(insert B 5 st_oa         5 0.250)
(insert B 5 sc_b          4 0.250)
(insert B 5 sc_f          3 0.500)
(insert B 5 st_ivcc1      3 0.500)
(insert B 5 sc_g          4 0.750)
(insert B 5 st_og         1 0.750)
(insert B 5 sc_h          2 0.750)
(insert B 5 st_ivss1      1 L)
(insert B 5 st_ivss1      1 0.750)
(*Block U*)
(insert B 6 sc_a          2 0.250)
(insert B 6 st_oa         6 0.250)
(insert B 6 sc_b          5 0.250)
(insert B 6 sc_f          4 0.500)
(insert B 6 st_ivcc1      4 0.500)
(insert B 6 sc_g          2 0.750)
(insert B 6 st_og         6 0.750)
(insert B 6 sc_h          5 0.750)
(insert B 6 st_ivss1      1 L)
(insert B 6 st_ivss1      1 0.750)
(*Block V*)
(insert B 7 sc_a          2 0.250)
(insert B 7 st_oa         7 0.250)
(insert B 7 sc_b          6 0.250)
(insert B 7 sc_f          4 0.500)
(insert B 7 st_ivcc1      4 0.500)
(insert B 7 sc_g          2 0.750)
(insert B 7 st_og         7 0.750)
(insert B 7 sc_h          6 0.750)
(insert B 7 st_ivss1      1 L)
(insert B 7 st_ivss1      1 0.750)
(*Block W*)
(insert C 1 sc_a          1 0.250)
(insert C 1 sc_b          1 0.750)
(insert C 1 sc_f          1 0.500)
(insert C 1 st_ivcc1      1 0.500)
(insert C 1 sc_i          1 0.500)
(insert C 1 sc_ivss1      1 L)
(insert C 1 st_ivss1      1 0.750)
(*Block X*)
(insert C 2 sc_a          1 0.250)
(insert C 2 st_oa         2 0.250)
(insert C 2 st_ob         1 0.750)
(insert C 2 sc_b          2 0.750)
(insert C 2 sc_f          1 0.500)
(insert C 2 st_ivcc1      1 0.750)
(insert C 2 sc_i          2 0.250)
(insert C 2 st_ivss1      1 L)
(insert C 2 st_ivss1      1 0.750)
(*Block Y*)
(insert C 3 sc_a          2 0.250)
(insert C 3 st_oa         3 0.250)
(insert C 3 st_ob         1 0.750)
(insert C 3 sc_b          2 0.750)
(insert C 3 sc_f          1 0.500)
(insert C 3 st_ivcc1      1 0.500)
(insert C 3 sc_i          3 0.500)
(insert C 3 st_ivss1      1 L)
(insert C 3 st_ivss1      1 0.750)
(*Block Z*)
(insert C 4 sc_a          2 0.250)
(insert C 4 st_oa         4 0.250)
(insert C 4 st_ob         1 0.750)
(insert C 4 sc_b          3 0.750)
(insert C 4 sc_f          2 0.750)
(insert C 4 st_ivcc1      2 0.500)
(insert C 4 sc_i          3 0.250)
(insert C 4 st_ivss1      1 L)
(insert C 4 st_ivss1      1 0.750)
(*Block Z_1*)
(insert C 5 sc_a          3 0.250)
(insert C 5 st_oa         5 0.250)
(insert C 5 st_ob         1 0.750)
(insert C 5 sc_b          3 0.750)
(insert C 5 sc_f          1 0.500)
(insert C 5 st_ivcc1      1 0.500)
(insert C 5 sc_i          4 0.500)
(insert C 5 st_ivss1      1 L)
(insert C 5 st_ivss1      1 0.750)
(*Block Z_2*)
(insert C 6 sc_a          3 0.250)
(insert C 6 st_oa         6 0.250)
(insert C 6 st_ob         1 0.750)
(insert C 6 sc_b          4 0.750)
(insert C 6 sc_f          2 0.750)
(insert C 6 st_ivcc1      2 0.750)
(insert C 6 sc_i          5 0.250)
(insert C 6 st_ivss1      1 L)
(insert C 6 st_ivss1      1 0.750)
(*Block Z_3*)
(insert C 7 sc_a          4 0.250)
(insert C 7 st_oa         7 0.250)
(insert C 7 st_ob         1 0.750)
(insert C 7 sc_b          4 0.750)
(insert C 7 sc_f          2 0.500)
(insert C 7 st_ivcc1      2 0.500)
(insert C 7 sc_i          6 0.500)
(insert C 7 st_ivss1      1 L)
(insert C 7 st_ivss1      1 0.750))
)
```

The first line of Block J begins with an "insert" command. It is followed by a specification of cluster "A". Cluster "A" is a cluster of groups that will be repeatedly inserted into the spare cell region. As indicated before, in this example, each group only contains one cell. The next item in the first line of Block J is the number 2, indicating that the cluster of groups in Block J will be inserted into 2 standard cell tracks or rows. The next item of code indicates that the group, "sc_a" will be inserted The next item in the code indicates that the group will be inserted at standard cell track 1 of the two standard cell tracks that are being processed. The final item in the line specifies the X-coordinate location within the standard cell track that the inserted group should be positioned. The position is specified as a multiple (0.250) of the total width of the standard cell track.

The subsequent lines in Block J follow the same format. Note that the second line of Block J inserts, at standard cell track 2, a group, st_oa, which contains a vertical wire terminator. The first line of Block G indicates that the input port for st_oa is sn_oa. The first line of Block E indicates that sn_oa is an output for the group sc_a. As stated in the last paragraph, the group sc_a was inserted in standard cell track 1. Given the common connectivity between these elements, at the time of placement and routing, the place and route tool will generate a vertical routing track 126 of the type described in relation to FIG. 7.

The third line of Block J inserts the group sc_c at a specified position (0.250×the length of standard cell track 2). Note that this is the same position as the inserted terminator described on the previous line. When more than one group is assigned to the same position, the first group is placed at the position, the second element is then placed adjacent to the originally positioned group. It should be noted at this time that groups with multiple cells can be inserted at a single position. The present example only assigns a group with a single cell to a position. However, subsequent instructions can assign additional groups to the same position.

Line 5 of Block J inserts a power connector st_ivcc1 in standard cell track 1. Line 4 of Block F indicates that this connector has an output sn_i4. Note in Block E that this output is connected to the inputs of cells xincmosf, sin00c, and sin00c. Thus, these cells will have power signals at their input gates, effectively disabling their function until the inputs are connected to signal tracks by the place and route tool at a later time, if necessary to correct logic errors in the initial implementation.

The last two lines of Block J insert ground connectors st_ivss1 at position L (Left on the X-axis; X=0) of row 1 and st_ivss1 at a multiple (0.750) of the total length of row 1. The ground connectors have the same output specification, sn_i1. Consequently, at the time of placement and routing, the place and route tool will generate a track between these cells, for example track 32 in FIG. 7. The resultant track may then be used to ground the inputs of the other inserted cells, for example cells 122F and 122G.

Note that blocks K through 0 insert the same cluster of groups. However, each block inserts the same groups into a different set of standard cell tracks. For example, in Block K, the set spans three standard cell tracks (1–3), but groups are only inserted in tracks 1 and 3. In Block L, the groups are inserted into tracks 1 through 4. In block M, the groups are inserted into tracks 1 through 5. In block N, the groups are inserted into blocks 1–6. In block 0, the groups span seven tracks, but are only inserted into tracks 1, 2, 4, 6, and 7.

Thus, the present invention uses a single cluster of groups and then repeatedly inserts that cluster of groups into different sets of standard cell tracks. This approach constitutes a well-defined technique to obtain a satisfactory distribution of spare cells.

The first block, Block I, of group A does not have the same cluster of groups as the remaining blocks in group A (Blocks J through Q). The reason for this is that the cells of block I are only inserted into a single track, not multiple tracks, as in the other blocks. Consequently, an ad hoc approach is taken in this situation.

The last two lines of Block I insert spare terminators. The second to last line of Block I inserts spare terminator st_row1 at the left position (X=0) of row 1, shown as terminator 140A in FIG. 7. The last ine of Block I inserts the spare terminator st_row1 at the right position (maximum X position) of row 1, shown as terminator 140B in FIG. 7. Line 1 of block H indicates that the terminator st_row1 has an input specification of sn_r1. Since the same input, sn_r1, is defined at each end of the spare track, the place and route tool will generate a track 142 between these spare terminators.

Block Q begins the cluster identified as group B. The syntax and techniques of Blocks Q through V are the same as the previously described blocks. Note that Block P is the first block of group B. As in the case of Block I, Block P only inserts cells into a single track. Therefore, the cells used in Block P do not conform with the cells used in Blocks Q through V.

Blocks W through Z_3 define the cluster identified as group C. The syntax and techniques of these blocks are consistent with those blocks previously described.

The insert blocks of the invention can be used in the following manner. Suppose it is determined that the standard cell region of the initially placed integrated circuit can accept a number of groups that is equivalent to the number of groups in eight blocks. In this case, clusters "A" "B" "C" would be sequentially accessed to insert cells into the standard cell region. Specifically, the rotation would be: A, B, C, A, B, C, A, B. For example, if the spare cell distribution mechanism 48 begins an insertion operation with the first track in a standard cell region of a semiconductor circuit, then Block I would be used, because it belongs to cluster A and specifies one track. If the insertion operation then moved to the second track, then Block Q would be used, because it belongs to cluster B and specifies two tracks. Insertion into sequential tracks is not necessary. The tracks used are typically selected on the basis of predetermined criteria that includes the number of tracks in the standard cell region and a reasonable division of those tracks. For example, a group of ten tracks may be divided to include the following groups (1, 5, 7), (2, 3, 4, 10), and (6, 7, 8, 9). In this case, the distribution mechanism 48 initially calls Block K, then Block S, then Block Z.

If the number of tracks is larger than the number of groups in a cluster, then more than one cluster may be used to insert groups into the large number of tracks. For example, if the number of tracks is 10, as provided in the foregoing example, then Block 0 from cluster A and Block R of cluster B may be used to fill the 10 tracks. It will be appreciated from the foregoing that the general goal is to obtain a good distribution of spare cells. Naturally, a number of related techniques may be used to achieve this goal.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. A method of inserting standard cells into an integrated circuit, said method comprising the steps of:

generating an initial layout of standard cells in an integrated circuit;

selecting a cluster of standard cell groups to be inserted into said initial layout of standard cells; and distributing said cluster of standard cell groups into said initial layout of standard cells by repeatedly inserting standard cell groups from said cluster into said initial layout of standard cells.

2. The method of claim 1 wherein said distributing step includes the step of distributing said cluster of standard cell groups in accordance with predetermined criteria based upon the number of tracks in said initial layout of standard cells.

3. The method of claim 1 wherein said distributing step includes the step of distributing said cluster of standard cell groups in accordance with predetermined criteria based upon the power consumption of cells in said cluster.

4. The method of claim 1 wherein said distributing step includes the step of distributing said cluster of standard cell groups in accordance with predetermined criteria based upon the logical function of cells in said cluster.

5. The method of claim 1 further comprising the step of inserting a first spare cell connector and a second spare cell connector in said initial layout of standard cells to force the routing of a track between said first spare cell and said second spare cell.

6. The method of claim 5 wherein said inserting step includes the step of inserting a first power connector and a second power connector in said initial layout of standard cells to force the routing of a horizontal routing track between said first power connector and said second power connector.

7. The method of claim 1 further comprising the step of inserting a spare terminator in said initial layout of standard cells to force the routing of a vertical track between said spare terminator and a standard cell.

8. An apparatus for automatically inserting standard cells into an integrated circuit layout, said apparatus comprising:
   a place and route tool to generate an initial layout of standard cells in an integrated circuit; and
   a spare cell distribution mechanism to repeatedly insert groups of standard cells from a cluster of standard cells into said initial layout of standard cells.

9. The apparatus of claim 8 wherein said spare cell distribution mechanism distributes said groups of standard cells into said initial layout of standard cells in accordance with predetermined criteria based upon the number of tracks in said initial layout of standard cells.

10. The apparatus of claim 8 wherein said spare cell distribution mechanism distributes said groups of standard cells into said initial layout of standard cells in accordance with predetermined criteria based upon the power consumption of cells in said groups of standard cells.

11. The apparatus of claim 8 wherein said spare cell distribution mechanism distributes said groups of standard cells into said initial layout of standard cells in accordance with predetermined criteria based upon the logical function of cells in said groups of standard cells.

12. The apparatus of claim 8 wherein said spare cell distribution mechanism distributes a spare terminator in said initial layout of standard cells to force the routing of a vertical track between said spare terminator and a standard cell.

13. The apparatus of claim 8 wherein said spare cell distribution mechanism distributes a first spare cell connector at one side of said initial layout of standard cells and a second spare cell connector at a second side of said initial layout of standard cells to force the routing, by said place and route tool, of an additional routing track between said first spare cell connector and said second spare cell connector.

14. The apparatus of claim 13 wherein said first spare cell connector is a first power connector and said second spare cell connector is a second power connector.

15. The apparatus of claim 13 wherein said first spare cell connector is a first ground connector and said second spare cell connector is a second ground connector.

* * * * *